US008299572B2

(12) United States Patent
Reisner

(10) Patent No.: US 8,299,572 B2
(45) Date of Patent: Oct. 30, 2012

(54) SEMICONDUCTOR DIE WITH BACKSIDE PASSIVE DEVICE INTEGRATION

(75) Inventor: Russ Reisner, Newbury Park, CA (US)

(73) Assignee: Skyworks Solutions, Inc, Woburn, MA (US)

( * ) Notice: Subject to any disclaimer, the term of this patent is extended or adjusted under 35 U.S.C. 154(b) by 243 days.

(21) Appl. No.: 12/156,988

(22) Filed: Jun. 6, 2008

(65) Prior Publication Data
US 2008/0315356 A1  Dec. 25, 2008

Related U.S. Application Data

(60) Provisional application No. 60/936,714, filed on Jun. 20, 2007.

(51) Int. Cl.
*H01L 27/08* (2006.01)
(52) U.S. Cl. ............... 257/531; 257/E27.027
(58) Field of Classification Search ........ 257/531, 257/E27.027
See application file for complete search history.

(56) References Cited

U.S. PATENT DOCUMENTS

| | | | |
|---|---|---|---|
| 5,973,396 A | 10/1999 | Farnworth | |
| 6,304,578 B1 * | 10/2001 | Fluss | 370/413 |
| 6,582,979 B2 | 6/2003 | Coccioli et al. | |
| 6,611,055 B1 | 8/2003 | Hashemi | |
| 2002/0009869 A1 * | 1/2002 | Cotte et al. | 438/612 |
| 2002/0127780 A1 * | 9/2002 | Ma et al. | 438/127 |
| 2002/0135373 A1 * | 9/2002 | James et al. | 324/322 |
| 2004/0217840 A1 * | 11/2004 | Lee et al. | 336/200 |
| 2005/0190036 A1 * | 9/2005 | Uriu et al. | 336/200 |
| 2006/0038257 A1 * | 2/2006 | Anzai | 257/531 |
| 2006/0170072 A1 * | 8/2006 | Nakashiba | 257/531 |
| 2006/0172459 A1 | 8/2006 | Karnezos | |
| 2007/0166867 A1 * | 7/2007 | Chow et al. | 438/65 |
| 2007/0268845 A1 * | 11/2007 | Martinez | 370/278 |
| 2008/0224297 A1 * | 9/2008 | Oppermann et al. | 257/690 |

* cited by examiner

*Primary Examiner* — Julio J Maldonado
*Assistant Examiner* — Hajar Kolahdouzan
(74) *Attorney, Agent, or Firm* — Knobbe Martens Olson & Bear, LLP

(57) ABSTRACT

According to an exemplary embodiment, a semiconductor die includes a backside surface opposite an active surface. The active surface includes at least one active device. The semiconductor die includes at least one passive device situated on the backside surface. The semiconductor die further includes an interconnect region situated over the active surface. The semiconductor die further includes at least one through-wafer via, where the at least one through-wafer via electrically connects the at least one passive device to the interconnect region. The interconnect region can include a number of solder bump pads or a number of bond pads.

18 Claims, 6 Drawing Sheets

SEMICONDUCTOR DIE WITH BACKSIDE PASSIVE DEVICE INTEGRATION

The present application claims the benefit of and priority to a provisional patent application entitled "Backside Microcircuit Patterning for Integrated Passive Devices," Ser. No. 60/936,714 filed on Jun. 20, 2007. The disclosure in that provisional application is hereby incorporated fully by reference into the present application.

BACKGROUND OF THE INVENTION

1. Field of the Invention

The present invention generally relates to the field of semiconductors. More particularly, the invention relates to semiconductor die integration and fabrication.

2. Background Art

While continuing to increase in functionality, electronic devices, such as cellular phones, also continue to decrease in size. As a result, electronic circuitry including semiconductor dies, such as radio frequency integrated circuits (RFICs), and passive devices, such as inductors and capacitors, in these electronic devices require housing on smaller circuit boards. Thus, various techniques and approaches have been utilized in a continuing effort to save circuit board space in electronic devices, such as cellular phones.

In one conventional approach to saving circuit board space, Low Temperature Co-fired Ceramic (LTCC) technology has been utilized to embed passive devices in a ceramic substrate, which can be utilized as a lid in a semiconductor die package. Although this conventional approach can save circuit board space, embedding passive devices in a ceramic substrate can undesirably increase manufacturing cost.

In another conventional approach, flip chip technology has been utilized to surface mount a semiconductor die to a circuit board. This conventional approach saves circuit board space by eliminating the need for space-consuming wire bonds that would otherwise be required to provide input/output (I/O), ground, and power connectivity to the semiconductor die. However, this conventional approach may not provide a sufficient benefit to offset the risks and development effort associated with configuring the semiconductor die in a flip chip configuration.

SUMMARY OF THE INVENTION

Semiconductor die with backside passive device integration, substantially as shown in and/or described in connection with at least one of the figures, as set forth more completely in the claims.

DETAILED DESCRIPTION OF THE INVENTION

The present invention is directed to a semiconductor die with backside passive device integration. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1A:
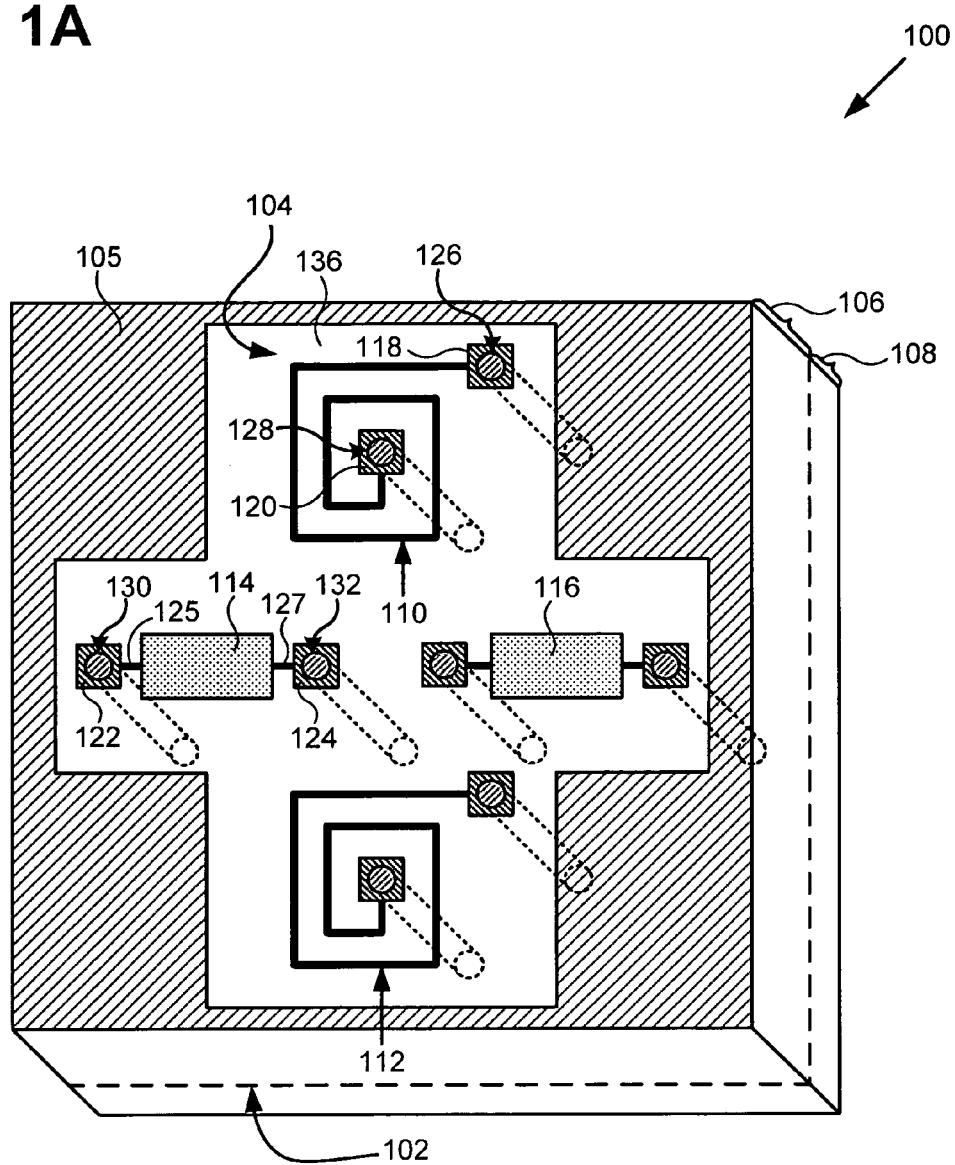
FIG. 1A shows a perspective view of an exemplary semiconductor die including exemplary backside passive devices, in accordance with one embodiment of the present invention.

FIG. 1A shows a perspective view of semiconductor die 100 in accordance with one embodiment of the present invention. Certain details and features have been left out of FIG. 1A that are apparent to a person of ordinary skill in the art. Semiconductor die 100 has active surface 102 and backside surface 104 and includes backside metallization layer 105, substrate 106, dielectric layer 136, interconnect region 108, inductors 110 and 112, capacitors 114 and 116, metal pads 118, 120, 122, and 124 (hereinafter "metal pads 118 through 124"), and through-wafer vias 126, 128, 130, and 132 (hereinafter "through-wafer vias 126 through 132"). It is noted that a "semiconductor die," such as semiconductor die 100, is also referred to as a "chip" or a "semiconductor chip" in the present application.

In the present application, an active surface, such as active surface 102, of a substrate, such as substrate 106, can include one or more active devices (not shown in FIG. 1A), which can be situated in a core region of the semiconductor die. The active surface underlies an interconnect region, such as interconnect region 108. Semiconductor die 100 be, for example, an RFIC, a memory IC, a processor IC, or other type of IC. Semiconductor die 100 can include, for example, a bulk acoustic wave (BAW) filter or a pseudomorphic high electron mobility transistor (pHEMT) switching device.

As shown in FIG. 1A, interconnect region 108 is situated over active surface 102 of substrate 106 and can include metal layers, interlayer dielectric layers, contacts, and vias, which are not shown in FIG. 1A. Interconnect region 108 can also include a number of I/O, ground, and power pads (not shown in FIG. 1A), which can be bond pads or solder bump pads.

Interconnect region 108 can provide electrical connectivity between active devices (not shown in FIG. 1A) formed on active surface 102 of substrate 106 and I/O, power, and ground pads (not shown in FIG. 1A), which can be formed in interconnect region 108. In the present embodiment, substrate 106 can comprise silicon. In other embodiments, substrate 106 can comprise gallium arsenide (GaAs) or other suitable semiconductor material. Also shown in FIG. 1A, inductors 110 and 112, metal pads 118 through 124, and capacitors 114 and 116 are situated on backside surface 104 of semiconductor die 100. It is noted that only metal pads 118 through 124 and through-wafer vias 126 through 132 are specifically discussed herein to preserve brevity. In semiconductor die 100, backside surface 104 refers to the top surface of dielectric layer 136, which is situated over the bottom surface of substrate 106. In an embodiment in which one or more passive devices, such as inductors 110 and 112 and capacitors 114 and 116, are situated directly on substrate 106, backside surface 104 refers to the bottom surface of substrate 106. Dielectric layer 136 can comprise silicon nitride or other suitable dielectric material.

Inductors 110 and 112 and metal pads 120 through 126 can comprise copper, gold, a metal stack comprising copper and gold, or other suitable metal or metal stack. In the present embodiment, inductors 110 and 112 have a spiral shape. In another embodiment, inductors 110 and 112 may have a shape other than a spiral. Inductor 110 is electrically connected between metal pads 118 and 120, which form respective first and second terminals of inductor 110. Inductors 110 and 112 can have a thickness of, for example, between 1.0 micron and 20.0 microns. Inductors 110 and 112 and metal pads 118 through 124 can be formed, for example, by depositing a thick layer of copper on backside surface 104 of semiconductor die 100 by utilizing an electrochemical deposition process or other suitable thick copper deposition process and appropriately patterning the thick layer of copper. The thick layer of copper can have a thickness of, for example, between 1.0 micron and 20.0 microns.

Capacitors 114 and 116 can each be, for example, a metal-insulator-metal (MIM) capacitor. Capacitor 114 is electrically connected to metal pads 122 and 124 by respective metal lines 125 and 127. Capacitors 114 and 116 can be fabricated by forming a stack of layers including a dielectric layer sandwiched between two metal layers in a manner known in the art and appropriately patterning the stack of layers. Further shown in FIG. 1A, through-wafer vias 126 through 132 are situated in backside surface 104 and extend through substrate 106. Through-wafer vias 126 through 132 can electrically connect respective metal pads 118 through 124 to interconnect region 108, through which (i.e. through interconnect region 108) a connection can be made to active surface 102 of semiconductor die 100. Thus, through-wafer vias 126 and 128 can electrically connect inductor 110 to active surface 102 and through-wafer vias 130 and 132 can electrically connect capacitor 114 to active surface 102.

Through-wafer vias 126 through 132 can comprise a metal such as copper, tungsten, or other suitable metal or metal stack. In an embodiment in which through-wafer vias 126 through 132 comprise copper and substrate 106 comprises silicon, the through-wafer vias can also include an adhesion/barrier layer to isolate the copper from the silicon substrate. In one embodiment, through-wafer vias, such as through-wafer vias 126 through 132, are not utilized. In such embodiment, metal pads 118 through 124 can comprise bond pads for receiving respective wirebonds. Thus, in such embodiment, electrical connectivity can be provided to inductors 110 and 112 and capacitors 114 and 116 by way of wirebonds.

Also shown in FIG. 1A, backside metallization layer 105 is situated over backside surface 104 of semiconductor die 100 and can comprise copper, a metal stack comprising copper and gold, or other suitable metal or metal stack. Backside metallization layer 105 surrounds inductors 110 and 112 and capacitors 114 and 116 and can surround provide a ground plane for semiconductor die 100. Backside metallization layer 105 can be formed by depositing and patterning a layer of metal, such as copper, in a manner known in the art. In one embodiment, backside metallization layer 105 may not be utilized. In another embodiment, backside metallization layer 105 may be situated adjacent to passive devices, such as inductors 110 and 112 and capacitors 114 and 116, without surrounding the passive devices.

In the present invention, passive devices, such as inductors 110 and 112 and capacitors 114 and 116 and resistors (not shown in FIG. 1A), can be formed on the backside surface of a semiconductor die, which can be configured as a flip-chip, i.e., a semiconductor die with an interconnect region including solder bump pads for solder bump electrical connectivity, or configured as a non-flip chip, i.e., a semiconductor die with an interconnect region including bond pads for providing electrical connectivity via wirebonds. In the present invention, passive devices can be formed on the backside surface of the semiconductor die by utilizing integrated passive device (IPD) technologies, including thick copper deposition. By integrating passive devices on the backside surface of a semiconductor die, such as flip-chip die, the present invention can save space by forming passive devices on a surface that is typically utilized only for backside metallization in a conventional semiconductor die.

Also, conventionally, inductors are typically formed on a circuit board by utilizing laminate-based technologies. However, by patterning inductors on the backside surface of a semiconductor die, the invention can form inductors by utilizing semiconductor processes, such as semiconductor lithography processes. As a result, the invention can achieve inductors having finer spacing and finer lines on the backside surface of the die. As a result, the prevent invention can achieve inductors having a higher inductance and a higher quality factor (Q) compared to inductors formed on a laminate substrate, such as a circuit board.

Figure 1B:
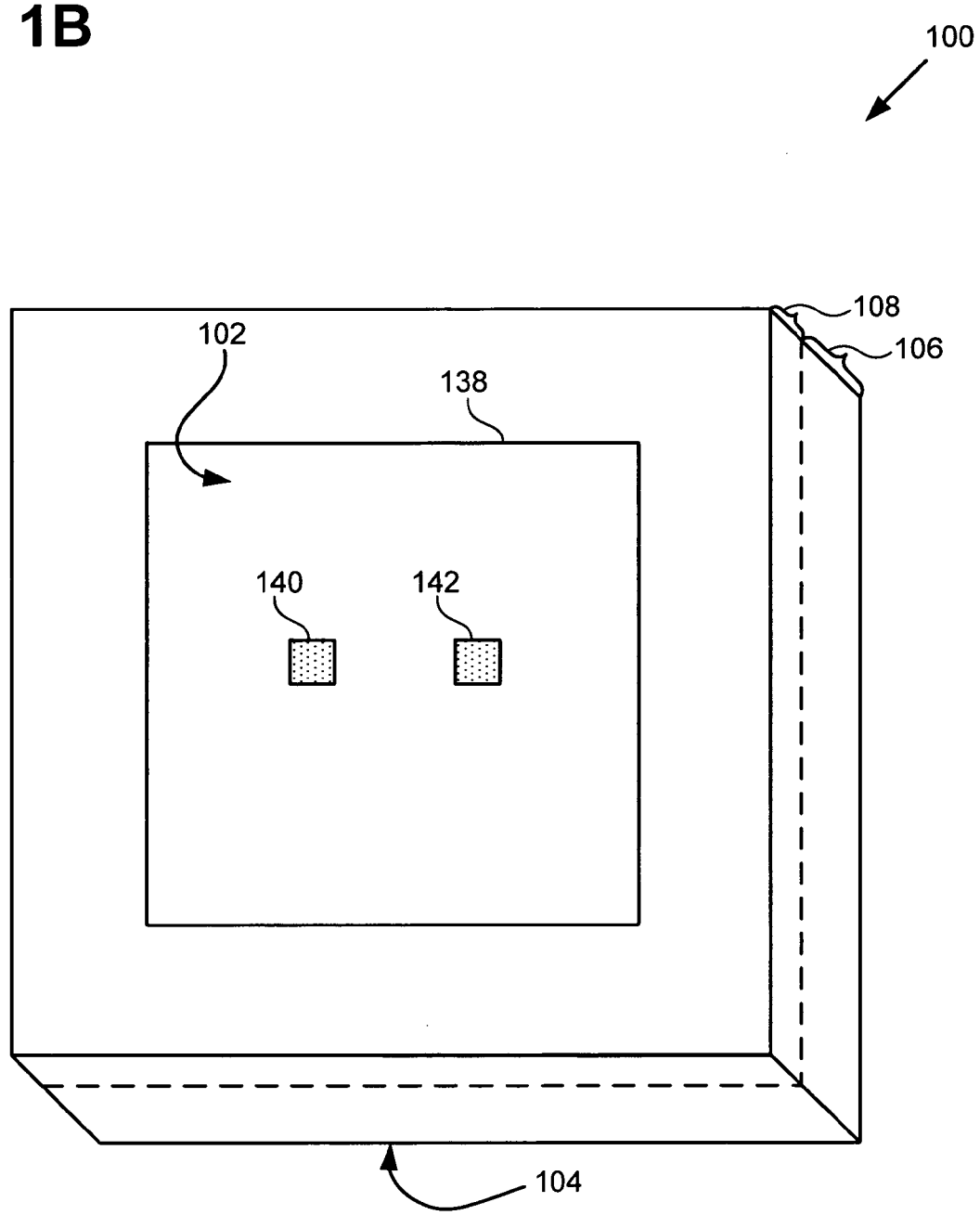
FIG. 1B shows another perspective view of the exemplary semiconductor die in FIG. 1A.

FIG. 1B shows another perspective view of semiconductor die 100 in accordance with one embodiment of the present invention. Active surface 102, backside surface 104, substrate 106 and interconnect region 108 correspond to the same elements in FIG. 1A and FIG. 1B. Active surface 102 of semiconductor die 100 includes core region 138, which includes active devices 140 and 142. Interconnect region 108 can include a number of solder bump pads (not shown in FIG. 1B) for receiving respective solder bumps, which enable semiconductor die 100 to be electrically connected to a laminate substrate (not shown in FIG. 1B), such as a circuit board, by utilizing flip chip technology. In flip chip technology, the semiconductor die is "flipped" over so that active surface of the die faces the laminate substrate. Electrical contact between the semiconductor die and the laminate substrate can be achieved through solder bumps that are placed on solder bump pads situated overlying the active surface in the interconnect region of the semiconductor die. In one embodiment, interconnect region 108 can include a number of bond pads for providing electrical connectivity to semiconductor die 100 via wirebonds.

Core region 138 of semiconductor die 100 can include, for example, an active portion of a BAW filter, a microprocessor, a memory array, or other types of active circuitry. Active devices 140 and 142, which are situated in core region 138 on active surface 102, can each be, for example, a transistor, such as an RF switching transistor or a gallium arsenide heterojunction bipolar transistor (GaAs HBT). In one embodiment, active surface 102 can include an active portion of a BAW filter and a balun for the BAW filter can include passive devices, such as inductors 110 and 112 (shown in FIG. 1A), which can be situated on backside surface 104 of semiconductor die 100 and be connected by, for example, through-wafer vias. In such embodiment, semiconductor die 100 can comprise a complete BAW filter, thereby advantageously enabling on-wafer BAW filter testing prior to die encapsulation.

Figure 2:
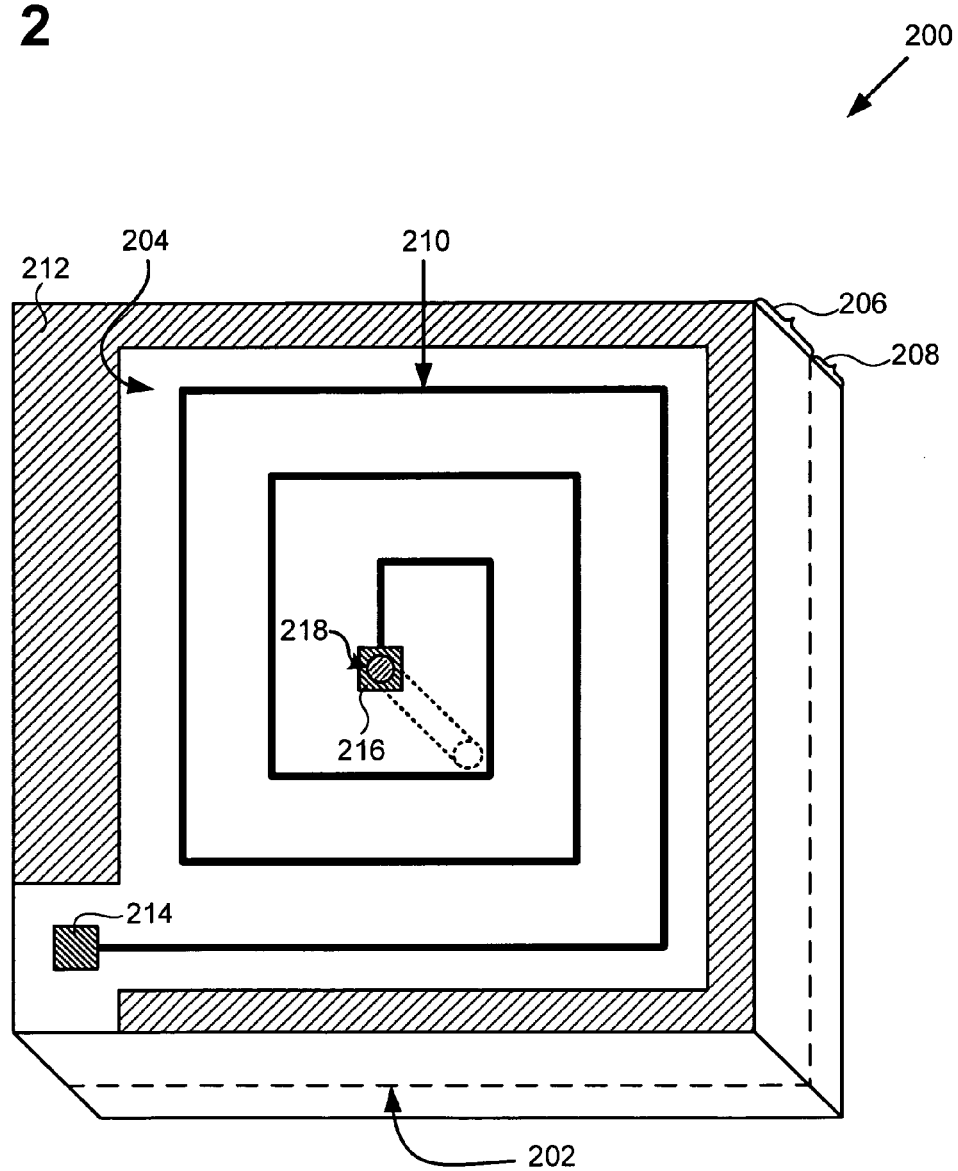
FIG. 2 shows a perspective view of an exemplary semiconductor die including an exemplary backside inductor, in accordance with one embodiment of the present invention.

FIG. 2 shows a perspective view of semiconductor die 200 in accordance with one embodiment of the present invention. Certain details and features have been left out of FIG. 2 that are apparent to a person of ordinary skill in the art. In FIG. 2, active surface 202, backside surface 204, substrate 206, and interconnect region 208 correspond, respectively, to active surface 102, backside surface 104, substrate 106, and interconnect region 108 in FIGS. 1A and 1B. Semiconductor die 200 includes active surface 202, backside surface 204, substrate 206, interconnect region 208, inductor 210, backside metallization layer 212, solder pad 214, metal pad 216, and through-wafer via 218. Similar to semiconductor die 100, semiconductor die 200 can be, for example, an RFIC, a memory IC, a processor IC, or other type of IC. Active surface 202 can include active devices, such as active devices 140 and 142 in FIG. 1B.

As shown in FIG. 2, interconnect region 208 is situated over active surface 202 of substrate 206 and can include metal layers, interlayer dielectric layers, contacts, and vias, which are not shown in FIG. 2. In the embodiment in FIG. 2, interconnect region 208 can include bond pads for providing wirebond electrical connectivity to semiconductor die 200. Substrate 206 can be substantially similar in composition as substrate 106 in FIGS. 1A and 1B. Also shown in FIG. 2, inductor 210, backside metallization layer 212, solder pad 214, and metal pad 216 are situated on backside surface 204 of semiconductor die 200. A first end of inductor 210 is connected to metal pad 216, which forms a first terminal of inductor 210, and a second end of inductor 210 is connected to solder pad 214, which forms a second terminal of inductor 210. In the embodiment in FIG. 2, inductor 210 has a spiral shape. In another embodiment, inductor 210 can have a shape other than a spiral. Inductor 210, solder pad 214, and metal pad 216 can comprises copper, gold, a copper/gold stack, or other suitable metal or metal stack.

Inductor 210, solder pad 214, and metal pad 216 can be formed by, for example, depositing a thick layer of copper on backside surface 204 of semiconductor die 200 by utilizing a electrochemical deposition process or other suitable thick copper deposition process and appropriately patterning the thick layer of copper. The thick layer of copper can have a thickness of, for example, between 1.0 micron and 20.0 microns. Solder pad 214 can be a "land" which can be directly soldered to a laminate substrate (e.g. a circuit board) to provide external electrical connectivity to inductor 210. Further shown in FIG. 2, through-wafer via 218 is in contact with metal pad 216 and extends through substrate 206 to interconnect region 208. Through-wafer via 218 electrically connects inductor 210 to interconnect region 208 and can be substantially similar in composition and formation as each of through-wafer vias 126 through 132 in FIG. 1A. Also shown in FIG. 2, backside metallization layer 212 is situated on backside surface 204 and is situated adjacent to inductor 210. Backside metallization layer 212 can be substantially similar in composition, thickness, and formation as backside metallization layer 105 in FIG. 1A.

By integrating a passive device, such as inductor 210, on the backside surface of semiconductor die 200, the invention achieves a semiconductor die providing similar advantages as aforementioned semiconductor 100 in the embodiment in FIGS. 1A and 1B. Also, by forming inductor 210 on the backside surface of semiconductor die 200, the embodiment in FIG. 2 advantageously achieves an inductor having a higher inductance and Q compared to a similar size inductor formed on a laminate substrate, such as a circuit board.

Figure 3:
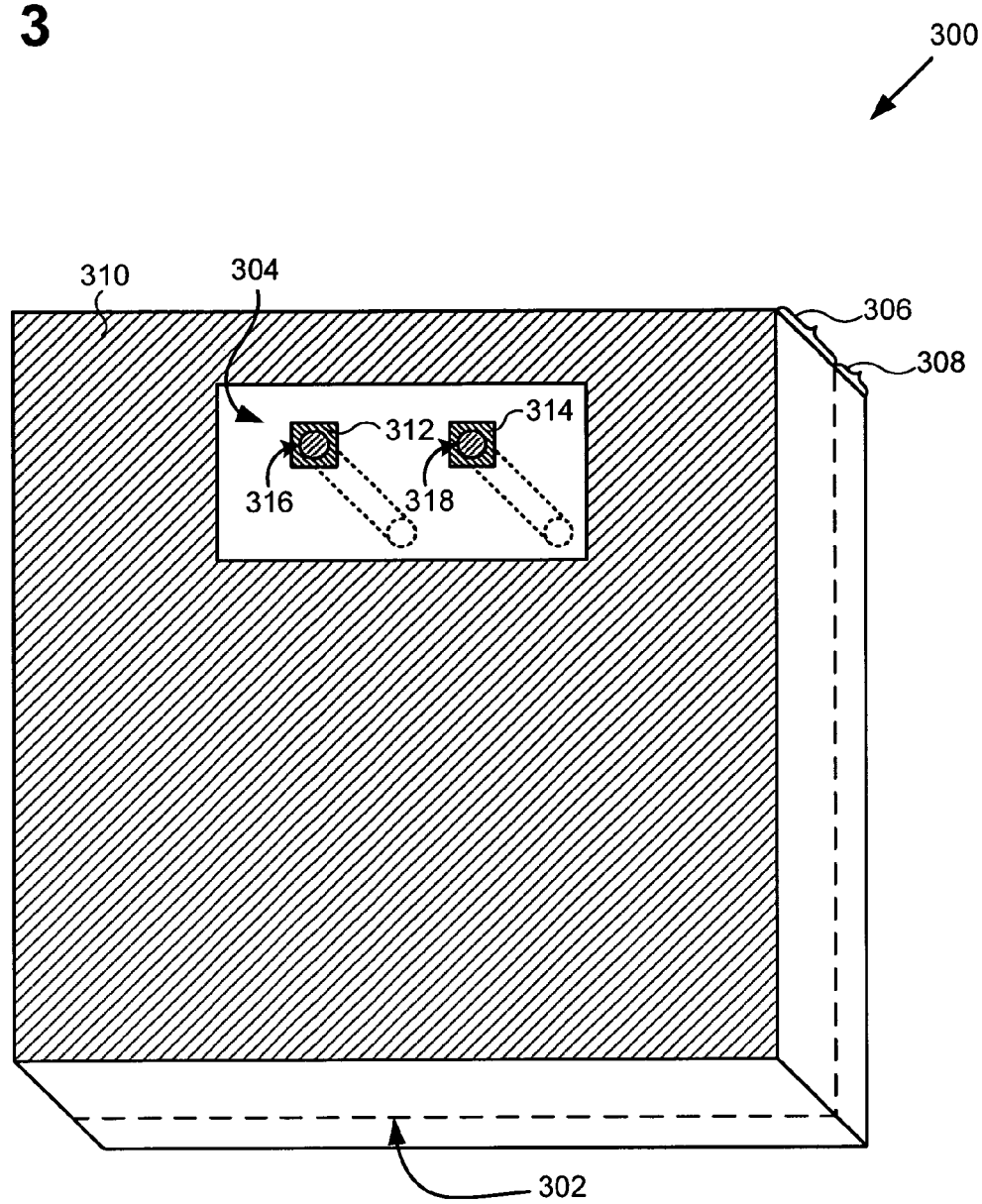
FIG. 3 shows a perspective view of an exemplary semiconductor die including exemplary backside I/O pads, in accordance with one embodiment of the present invention.

FIG. 3 shows a perspective view of semiconductor die 300 in accordance with one embodiment of the present invention. Certain details and features have been left out of FIG. 3 that are apparent to a person of ordinary skill in the art. In FIG. 3, active surface 302, backside surface 304, substrate 306, and interconnect region 308 correspond, respectively, to active surface 102, backside surface 104, substrate 106, and interconnect region 108 in FIGS. 1A and 1B. Semiconductor die 300 includes active surface 302, backside surface 304, substrate 306, interconnect region 308, backside metallization layer 310, metal pad 312 and 314, and through-wafer vias 316 and 318. Similar to semiconductor die 100, semiconductor die 300 can be, for example, an RFIC, a memory IC, a processor IC, or other type of IC, such as a monolithic microwave IC (MMIC). Active surface 302 can includes active devices, such as active devices 140 and 142 in FIG. 1B.

As shown in FIG. 3, interconnect region 308 is situated over active surface 302 of substrate 306 and can include metal layers, interlayer dielectric layers, contacts, and vias, which are not shown in FIG. 3. Interconnect region 308 can also include bond pads (not shown in FIG. 3) for providing wirebond electrical connectivity to semiconductor die 300. Substrate 306 can be substantially similar in composition as substrate 106 in FIGS. 1A and 1B. Also shown in FIG. 3, backside metallization layer 310 and I/O (input/output) pads 312 and 314 are situated on backside surface 304 of semiconductor die 300. I/O pads 312 and 314 can be substantially similar in composition, thickness, and formation to metal pads 118 through 124 in FIG. 1A. In the present embodiment, I/O pads 312 and 314 are surrounded by backside metallization layer 310, which can be substantially similar in composition, thickness, and formation to backside metallization layer 105 in FIG. 1A. In another embodiment, I/O pads 312 and 314 may not be surrounded by backside metallization layer 310. It is noted that although only two I/O pads are shown in FIG. 3 to preserve brevity, more that two I/O pads, such as I/O pads 312 and 314, may be formed on backside surface 304 of semiconductor die 300.

Further shown in FIG. 3, through-wafer vias 316 and 318 are in contact with respective metal pads 312 and 314 and extend through substrate 306 to interconnect region 308. Through-wafer vias 316 and 318 electrically connect respective metal pads 312 and 314 to interconnect region 308 and can be substantially similar in composition and formation as through-wafer vias 126 through 132 in FIG. 1A.

By forming I/O pads on backside surface 304 of semiconductor die 310 and electrically connecting the I/O pads to interconnect region 308 by respective through-wafer vias, the I/O pads can provide I/O signal routing that would otherwise be provided by a corresponding number of bond pads in the interconnect region of the die. As a result, the embodiment of the invention can reduce the number of bond pads required in the interconnect region of the die, thereby eliminating the wirebonds associated with those bond pads. Since wirebonds cause the semiconductor die to consume a large amount of space on a circuit board, by reducing the number of required wirebonds, the embodiment of the invention in FIG. 3 can reduce the amount of circuit board space consumed by the die.

Figure 4:
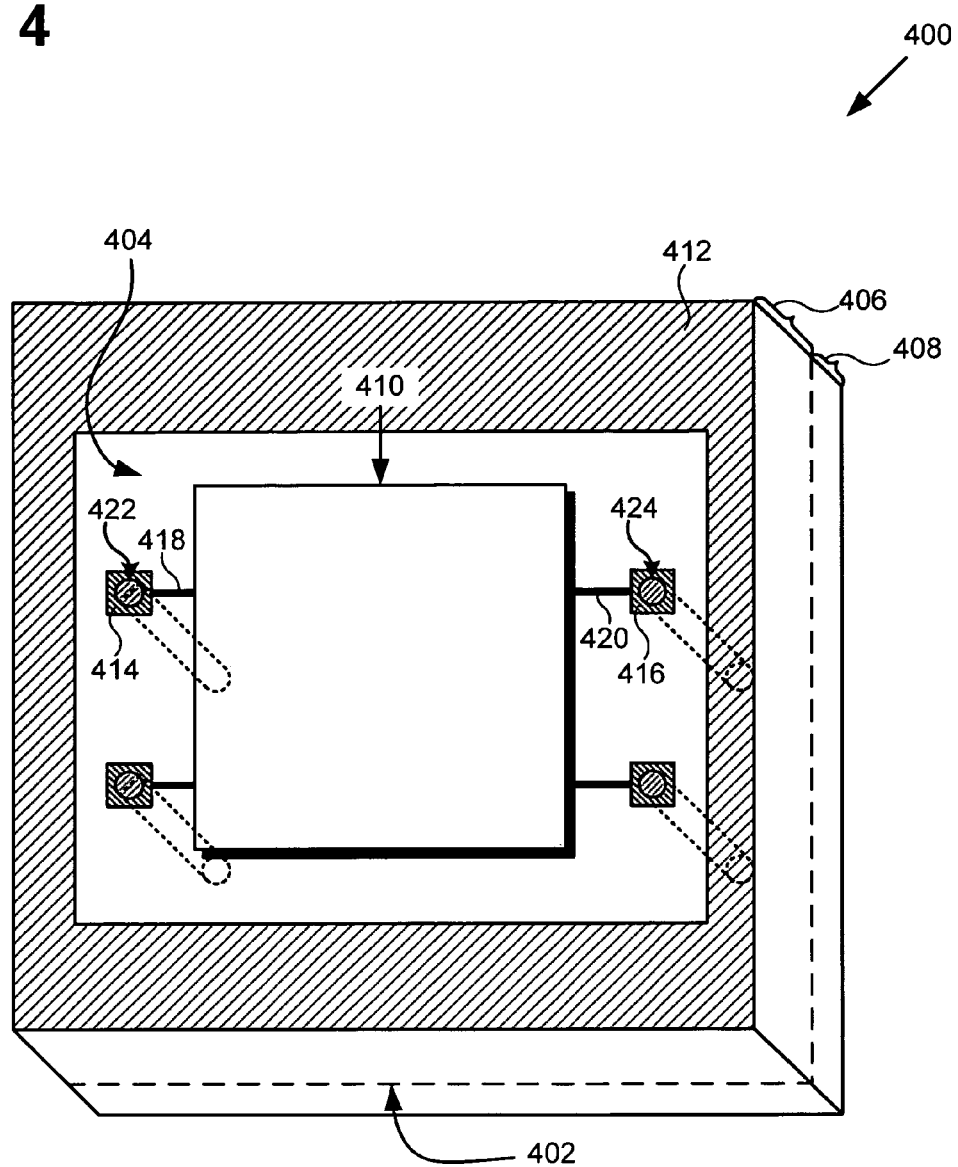
FIG. 4 shows a perspective view of an exemplary semiconductor die including an exemplary backside passive circuit, in accordance with one embodiment of the present invention.

FIG. 4 shows a perspective view of semiconductor die 400 in accordance with one embodiment of the present invention. Certain details and features have been left out of FIG. 4 that are apparent to a person of ordinary skill in the art. In FIG. 4, active surface 402, backside surface 404, substrate 406, and interconnect region 408 correspond, respectively, to active surface 102, backside surface 104, substrate 106, and interconnect region 108 in FIGS. 1A and 1B. Semiconductor die 400 includes active surface 402, backside surface 404, substrate 406, interconnect region 408, passive circuit 410, backside metallization layer 412, metal pad 414 and 416, metal lines 418 and 420, and through-wafer vias 422 and 424. Similar to semiconductor die 100 in FIGS. 1A and 1B, semiconductor die 400 can be, for example, an RFIC, a memory IC, a processor IC, or other type of IC. Active surface 402 can includes active devices, such as active devices 140 and 142 in FIG. 1B. In one embodiment, active surface 402 can include a switching device, such as a pHEMT switching device.

As shown in FIG. 4, interconnect region 408 is situated over active surface 402 of substrate 406 and can include metal layers, interlayer dielectric layers, contacts, and vias, which are not shown in FIG. 4. Interconnect region 408 can also include bond pads (not shown in FIG. 3) for providing wirebond electrical connectivity to semiconductor die 400. In one embodiment, semiconductor die 400 can be configured as a flip-chip, wherein interconnect region 408 can include solder bump pads and associated solder bumps to provide external electrical connectivity for the die. Substrate 406 can be substantially similar in composition as substrate 106 in FIGS. 1A and 1B. Also shown in FIG. 4, passive circuit 410, backside metallization layer 412, metal pads 414 and 416, and metal lines 418 and 420 are situated on backside surface 404 of semiconductor die 400. In the present embodiment, passive circuit 410, metal pads 414 and 416, and metal lines 418 and 420 are surrounded by backside metallization layer 412, which can be substantially similar in composition, thickness, and formation to backside metallization layer 105 in FIG. 1A. Passive circuit 410 can include a number of passive devices, such as inductors 110 and 112 and capacitors 114 and 116 in FIG. 1A and resistors, and can be a diplexer, a balun for a BAW filter, or other type of passive circuit. Metal pads 414 and 416 and metal lines 418 and 420 can be substantially similar in composition, thickness, and formation to metal pads 118 through 124 in FIG. 1A. Metal lines 418 and 420 electrically connect passive circuit 410 to respective metal pads 414 and 416.

Further shown in FIG. 4, through-wafer vias 422 and 424 are in contact with respective metal pads 414 and 416 and extend through substrate 406 to interconnect region 408. Through-wafer vias 422 and 424 electrically connect respective metal pads 414 and 416 to interconnect region 408 and can be substantially similar in composition and formation as through-wafer vias 126 through 132 in FIG. 1A. It is noted that only metal pads 414 and 416, metal lines 418 and 420, and through-wafer vias 422 and 424 are specifically discussed herein to preserve brevity.

In the embodiment in FIG. 4, passive circuit 410 is electrically connected to interconnect region 408 by metal lines, such as metal lines 418 and 420, metal pads, such as metal pads 414 and 416, and through-wafer vias, such as through-wafer vias 422 and 424. By integrating passive circuit 410 on backside surface 404 of semiconductor die 400, the embodiment of the invention in FIG. 4 achieves a semiconductor die that provides similar advantages as aforementioned semiconductor die 100 in FIGS. 1A and 1B.

Figure 5:
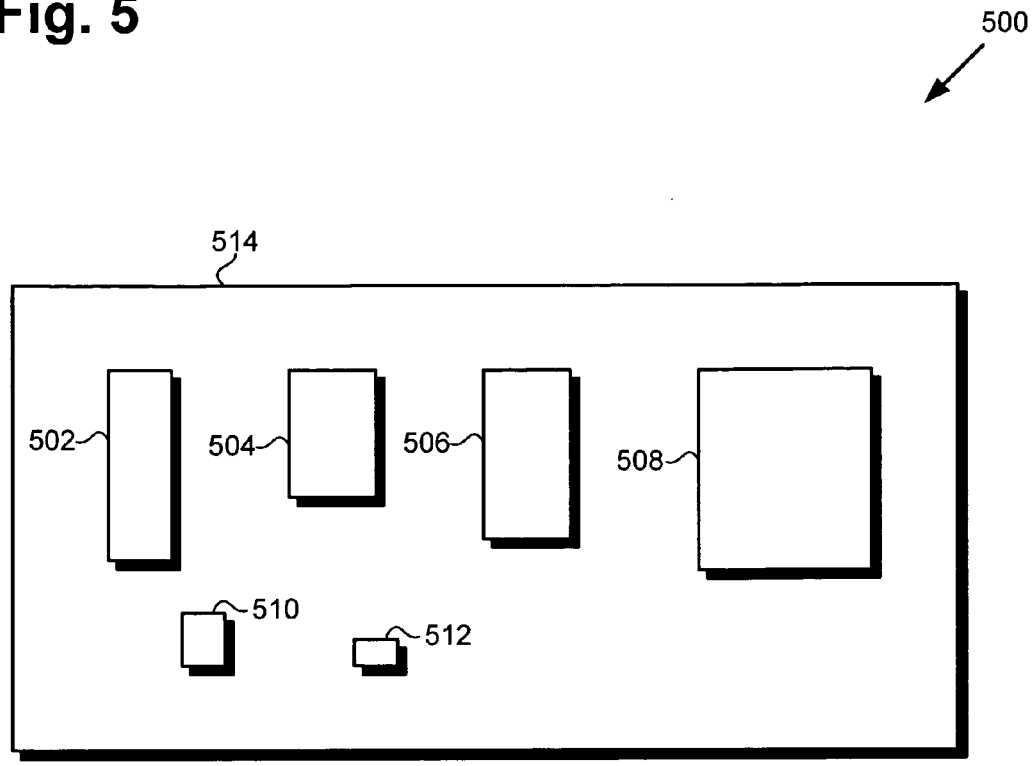
FIG. 5 is a diagram of an exemplary electronic system including an exemplary chip or die with backside passive device integration in accordance with one embodiment of the present invention.

FIG. 5 illustrates a diagram of an exemplary electronic system including an exemplary chip or die in accordance with one embodiment of the present invention. Electronic system 500 includes exemplary modules 502, 504, and 506, IC chip or semiconductor die 508, discrete components 510 and 512, residing in and interconnected through circuit board 514. In one embodiment, electronic system 500 may include more than one circuit board. IC chip 508 can comprise one of the invention's semiconductor dies, such as semiconductor die 100 in FIGS. 1A and 1B, semiconductor die 200 in FIG. 2, semiconductor die 300 in FIG. 3, or semiconductor die 400 in FIG. 4, as described above.

As shown in FIG. 5, modules 502, 504, and 506 are mounted on circuit board 514 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electromechanical motor control module, or a field programmable gate array (FPGA), or any other kind of module utilized in modern electronic circuit boards. Circuit board 514 can include a number of interconnect traces (not shown in FIG. 5) for interconnecting modules 502, 504, and 506, discrete components 510 and 512, and IC chip 508.

Also shown in FIG. 5, IC chip 508 is surface mounted on circuit board 514 and comprises an embodiment of the invention's semiconductor die. In one embodiment, IC chip 508 may be mounted on a substrate in a semiconductor package, which can be in turn mounted on circuit board 514. In another embodiment, IC chip 508 may not be mounted on circuit board 514, and may be interconnected with other modules on different circuit boards. Further shown in FIG. 5, discrete components 510 and 512 are mounted on circuit board 514 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 500 can be utilized in, for example, a wired or wireless communications device, a cell phone, a switching device, a router, a repeater, a codec, a wired or wireless LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, or a digitally-controlled medical equipment, or in any other kind of system, device, component or module utilized in modern electronics applications.

Thus, as discussed above in the embodiments of the invention in FIGS. 1A and 1B, 2, 3, and 4, the invention provides a semiconductor die having a backside surface that can be utilized to integrate one or more passive devices, such as inductors and capacitors, or a passive circuit, such as a balun or a diplexer, or for I/O signal routing. In contrast, the backside surface of a conventional semiconductor die is typically utilized only for backside metallization. Thus, by utilizing the backside surface for integration of passive devices or a passive circuit, the invention provides a semiconductor die that can save circuit board space that would otherwise be required to house the passive devices or the passive circuit formed on the backside surface of the die.

Also, in an embodiment of the invention, the backside surface of the semiconductor die can include I/O pads for signal routing. The I/O pads on the backside surface of the die can replace a corresponding number of bond pads in the interconnect region of the die, thereby saving circuit board space by reducing a corresponding number of space-consuming wirebonds that would otherwise be required for I/O signal routing. Additionally, by utilizing semiconductor processes, such as semiconductor lithography processes, to form inductors on the backside surface of the die, the invention can advantageously provide inductors having increased inductance and Q (quality factor).

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a semiconductor die with backside passive device integration has been described.

The invention claimed is:

1. A semiconductor die comprising:
a substrate including a backside surface opposite an active surface, the backside surface including at least one passive device and at least one input/output (I/O) pad electrically coupled to the at least one passive device, the active surface of the substrate including at least one active device;
a metallization layer formed over the backside surface, the metallization layer substantially surrounding and separate from the at least one passive device; and
an interconnect region adjacent to and surrounding the active surface and opposed to the backside surface such that the active surface of the substrate underlies the interconnect region and is between the backside surface and the interconnect region.

2. The semiconductor die of claim 1 wherein the interconnect region enables electrical connections.

3. The semiconductor die of claim 2 further comprising at least one through-wafer via electrically connecting said at least one passive device to an electrically conductive element of said interconnect region.

4. The semiconductor die of claim 2 wherein said at least one passive device includes an inductor having a first terminal and a second terminal, at least one of the first and second terminals of said inductor electrically connecting to said interconnect region.

5. The semiconductor die of claim 4 further comprising at least one through-wafer via electrically connecting the at least one of the first and second terminals of said inductor to said active surface.

6. The semiconductor die of claim 4 wherein said inductor has a thickness of between 1.0 micrometer and 20.0 micrometer.

7. The semiconductor die of claim 2 wherein said interconnect region includes a plurality of solder bump pads.

8. The semiconductor die of claim 1 wherein said semiconductor die is coupled to a circuit board as a part of an electronic system.

9. A semiconductor die comprising:
a substrate including a backside surface opposite an active surface, the backside surface including at least one passive device, the active surface including at least one active device;
a metallization layer formed over the backside surface, the metallization layer adjacent to and separate from the at least one passive device on the backside surface;
an interconnect region situated adjacent and surrounding the active surface and opposed to the backside surface such that the active surface underlies the interconnect region and is between the backside surface and the interconnect region; and
at least one input/output (I/O) pad situated on the backside surface, the at least one I/O pad electrically connecting to the interconnect region of the semiconductor die.

10. The semiconductor die of claim 9 further comprising at least one through-wafer via electrically connecting said at least one I/O pad to said interconnect region of said semiconductor die.

11. The semiconductor die of claim 9 wherein said metallization layer surrounds said at least one I/O pad.

12. The semiconductor die of claim 9 wherein the backside surface includes a plurality of wirebond pads.

13. A semiconductor die comprising:
a backside surface opposite an active surface, the backside surface including an inductor patterned on the backside surface, said active surface including an active portion of a bulk acoustic wave (BAW) filter, the inductor forming at least a part of a balun of the BAW filter;
an interconnect region situated adjacent and surrounding said active surface and opposed to the backside surface such that the active surface underlies the interconnect region and is between the backside surface and the interconnect region;
a metallization layer situated over the backside surface, the metallization layer substantially surrounding and separate from the inductor; and
at least one through-wafer via electrically connecting the inductor to the interconnect region.

14. The semiconductor die of claim 13 further comprising at least another through-wafer via electrically connecting the inductor to the active surface.

15. The semiconductor die of claim 13 wherein said interconnect region includes a plurality of solder bump pads.

16. The semiconductor die of claim 13 wherein said backside surface includes a plurality of bond pads.

17. The semiconductor die of claim 9 wherein the at least one passive device includes a diplexer.

18. The semiconductor die of claim 17 further comprising at least one through-wafer via wherein the at least one active device includes a radio-frequency (RF) switch, the at least one through-wafer via electrically connecting the RF switch to the diplexer.

* * * * *